(12) United States Patent
Lai et al.

(10) Patent No.: US 8,356,215 B2
(45) Date of Patent: Jan. 15, 2013

(54) TESTING APPARATUS AND METHOD FOR ANALYZING A MEMORY MODULE OPERATING WITHIN AN APPLICATION SYSTEM

(75) Inventors: Bosco Chun Sang Lai, Markham (CA); Sunny Lai-Ming Chang, Markham (CA); Lawrence Wai Cheung Ho, Mississauga (CA); Shu Man Choi, Markham (CA)

(73) Assignee: Kingtiger Technology (Canada) Inc., Markham, Ontario (CA)

( * ) Notice: Subject to any disclaimer, the term of this patent is extended or adjusted under 35 U.S.C. 154(b) by 205 days.

(21) Appl. No.: 13/008,687

(22) Filed: Jan. 18, 2011

(65) Prior Publication Data
US 2011/0179324 A1    Jul. 21, 2011

Related U.S. Application Data

(60) Provisional application No. 61/296,353, filed on Jan. 19, 2010.

(51) Int. Cl.
*G11C 29/00* (2006.01)
(52) U.S. Cl. ........... 714/718; 714/25; 714/733; 714/742
(58) Field of Classification Search ............ 714/25, 714/718, 731, 744
See application file for complete search history.

(56) References Cited

U.S. PATENT DOCUMENTS

| | | | |
|---|---|---|---|
| 4,001,818 A | 1/1977 | Radichel et al. | |
| 4,379,259 A | 4/1983 | Varadi et al. | |
| 4,484,329 A | 11/1984 | Slamka et al. | |
| 4,821,238 A | 4/1989 | Tatematsu | |
| 4,965,799 A | 10/1990 | Green et al. | |
| 4,992,850 A | 2/1991 | Corbett et al. | |
| 5,224,107 A | 6/1993 | Mattes | |
| 5,375,228 A | 12/1994 | Leary et al. | |
| 5,619,430 A | 4/1997 | Nolan et al. | |
| 5,619,926 A | 4/1997 | Engelmann et al. | |
| 5,720,031 A | 2/1998 | Lindsay | |

(Continued)

FOREIGN PATENT DOCUMENTS
WO    0229824 A3    4/2002

OTHER PUBLICATIONS

Hermann, A.L., Diagnostic Data Comparator, IBM Technical Disclosure Bulletin, IBM Corp. New York, vol. 24, No. 5, Oct. 1981, pp. 2591-2592.

*Primary Examiner* — Esaw Abraham
(74) *Attorney, Agent, or Firm* — Bereskin & Parr LLP/S.E.N.C.R., s.r.l.

(57) ABSTRACT

A testing apparatus for analyzing a memory module under test operating within an application system, wherein the memory module under test is coupled to a processor of the application system, is disclosed herein. In at least one embodiment, the testing apparatus comprises a first interface for coupling to the application system, a second interface for coupling to a reference memory module, a controller coupled to the first and second interfaces, at least one comparator, and a data logging unit. The data logging unit is configured to receive logging data from the controller and at least one test result from the at least one comparator, and to record, in a memory, at least a subset of the logging data, such that more specific details of memory errors revealed during behavioral testing of memory modules may be identified, examined, and stored for subsequent analysis.

31 Claims, 5 Drawing Sheets

U.S. PATENT DOCUMENTS

| | | |
|---|---|---|
| 5,794,175 A | 8/1998 | Conner |
| 5,844,913 A | 12/1998 | Hassoun et al. |
| 5,937,367 A | 8/1999 | Eckardt |
| 5,940,875 A | 8/1999 | Inagaki et al. |
| 5,959,914 A | 9/1999 | Gates et al. |
| 5,961,657 A | 10/1999 | Park et al. |
| 5,995,424 A | 11/1999 | Lawrence et al. |
| 5,995,915 A | 11/1999 | Reed et al. |
| 6,002,623 A | 12/1999 | Stave et al. |
| 6,014,759 A | 1/2000 | Manning |
| 6,018,484 A | 1/2000 | Brady |
| 6,029,262 A | 2/2000 | Medd et al. |
| 6,055,653 A | 4/2000 | LeBlanc et al. |
| 6,055,661 A | 4/2000 | Luk |
| 6,058,055 A | 5/2000 | Brunelle |
| 6,134,690 A | 10/2000 | Ivaturi et al. |
| 6,178,526 B1 | 1/2001 | Nguyen et al. |
| 6,275,962 B1 | 8/2001 | Fuller et al. |
| 6,313,657 B1 | 11/2001 | Hashimoto |
| 6,324,655 B1 | 11/2001 | Fay |
| 6,327,556 B1 | 12/2001 | Geiger et al. |
| 6,345,372 B1 | 2/2002 | Dieckmann et al. |
| 6,389,525 B1 | 5/2002 | Reichert et al. |
| 6,425,095 B1 | 7/2002 | Yasui |
| 6,430,720 B1 | 8/2002 | Frey et al. |
| 6,452,411 B1 | 9/2002 | Miller et al. |
| 6,546,511 B1 | 4/2003 | Sim et al. |
| 6,574,759 B1 | 6/2003 | Woo et al. |
| 6,615,379 B1 | 9/2003 | Tripp et al. |
| 6,646,936 B2 | 11/2003 | Hamamatsu et al. |
| 6,701,474 B2 | 3/2004 | Cooke et al. |
| 6,731,125 B2 | 5/2004 | Chang |
| 6,754,117 B2 | 6/2004 | Jeddeloh |
| 6,851,076 B1 | 2/2005 | Cook, III et al. |
| 6,880,118 B2 | 4/2005 | Chen et al. |
| 6,888,366 B2 | 5/2005 | Kim et al. |
| 6,910,146 B2 | 6/2005 | Dow |
| 6,996,749 B1 | 2/2006 | Bains et al. |
| 7,085,980 B2 | 8/2006 | Martin-de-Nicolas et al. |
| 7,088,122 B2 | 8/2006 | Hartmann et al. |
| 7,092,902 B2 | 8/2006 | Eldridge et al. |
| 7,119,567 B2 | 10/2006 | Ma et al. |
| 7,131,046 B2 | 10/2006 | Volkerink et al. |
| 7,142,003 B2 | 11/2006 | Kanbayashi et al. |
| 7,539,912 B2 | 5/2009 | Chan et al. |

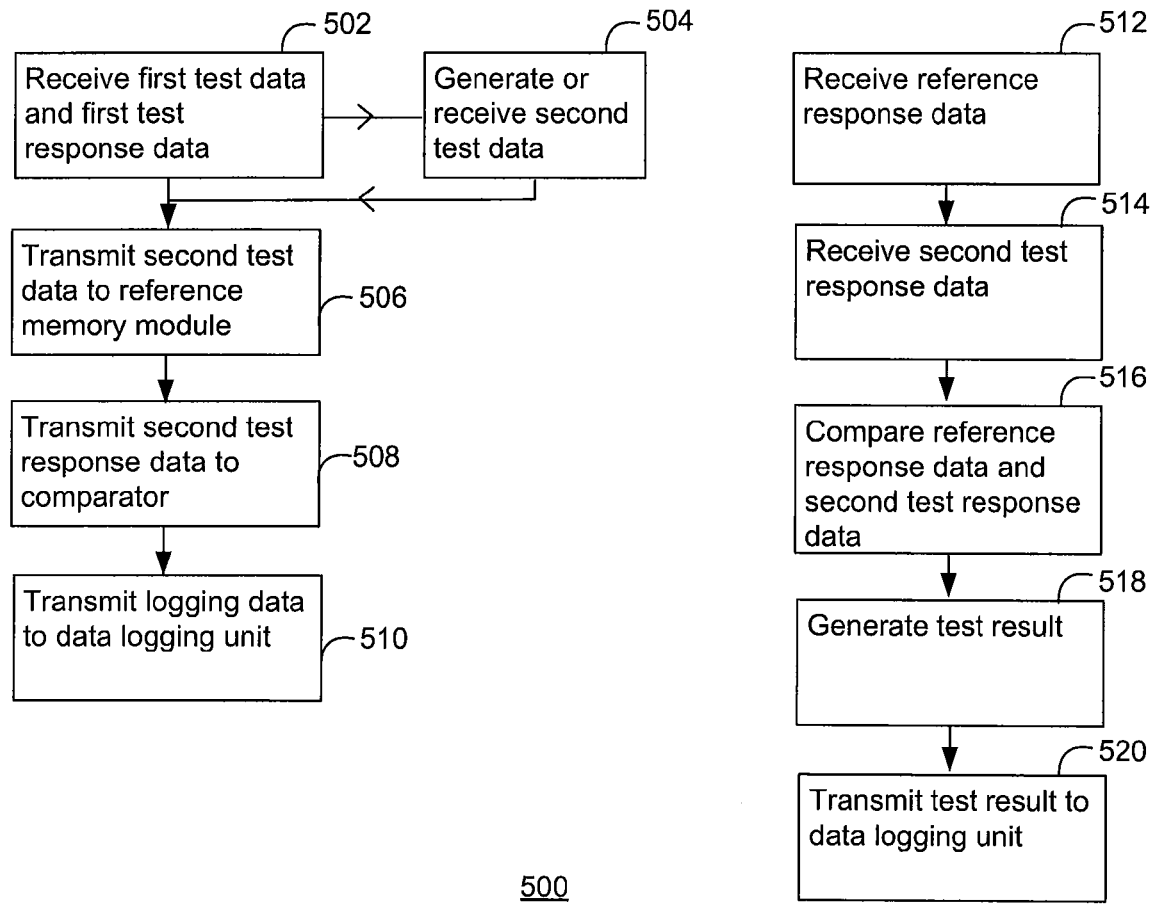

TESTING APPARATUS AND METHOD FOR ANALYZING A MEMORY MODULE OPERATING WITHIN AN APPLICATION SYSTEM

CROSS-REFERENCE TO RELATED APPLICATION

This application claims the benefit of U.S. Provisional Patent Application No. 61/296,353, filed Jan. 19, 2010. The entirety of U.S. Provisional Patent Application No. 61/296,353 is hereby incorporated by reference.

FIELD

Embodiments described herein relate generally to systems and methods for testing integrated circuit devices. More particularly, the described embodiments relate to systems and methods for analyzing the behavior of memory modules within an environment that is representative of the application environment (e.g. a personal computer) in which a memory module will be used.

BACKGROUND

Typically, memory modules are tested and certified by memory manufacturers to make sure that memory modules properly operate on signals with parameters that are allowed by appropriate specifications.

Not only are memory modules subject to testing to determine whether they meet specifications as specified by a manufacturer, but memory modules are also typically subject to other conventional tests such as pattern testing and parametric tests. Pattern testing of memory modules is an organized method of exercising each memory cell to verify its functionality. Parametric tests may be designed to verify operating parameters such as, for example, power consumption, standby current, leakage current, voltage levels, and access time.

Conventionally, memory modules may be tested to verify how they perform particular functions during specially-designed testing procedures. Each testing procedure typically targets a particular function performed by the memory module. These conventional tests attempt to reveal whether or not a memory module being tested is likely to fail when used. For example, most conventional tests performed on memory modules are successful, to varying degrees, at detecting parametric failures (e.g. a memory cell may become stuck at 1 or 0), soft failures (e.g. presence of cross talk or linkage between memory cells), and refresh failures, for example.

Some known systems for testing memory modules employ reference memory modules. One example of a known test system in which functional testing of memory modules is performed is described in U.S. Pat. No. 6,055,653 in the name of LeBlanc et al. A memory tester is disclosed, which employs a processor that writes data to a reference module and memory modules under test, reads them back, and compares outputs from the reference module and from the memory modules under test.

However, this known testing method may not address the testing of how memory modules might function while operating in a particular application system, and may not readily detect behavioral failures. A behavioral failure is a failure that occurs when a memory module is used in an actual application system (for example, a failure that occurs as a result of a specific command or access sequence made to a memory module that may arise during normal personal computer (PC) operations). It is very difficult for conventional testing methods to detect such failures, since the tests employed are not truly indicative of how a memory module will behave under its intended application. In fact, a memory module that has only been subject to conventional tests will have never been operated in an actual application environment.

BRIEF DESCRIPTION OF THE DRAWINGS

For a better understanding of embodiments of the systems and methods described herein, and to show more clearly how they may be carried into effect, reference will be made, by way of example, to the accompanying drawings in which:

FIGS. 5A-5C are flowcharts illustrating acts performed in a method of testing a memory module, in accordance with at least one embodiment.

DETAILED DESCRIPTION

Figure 1:
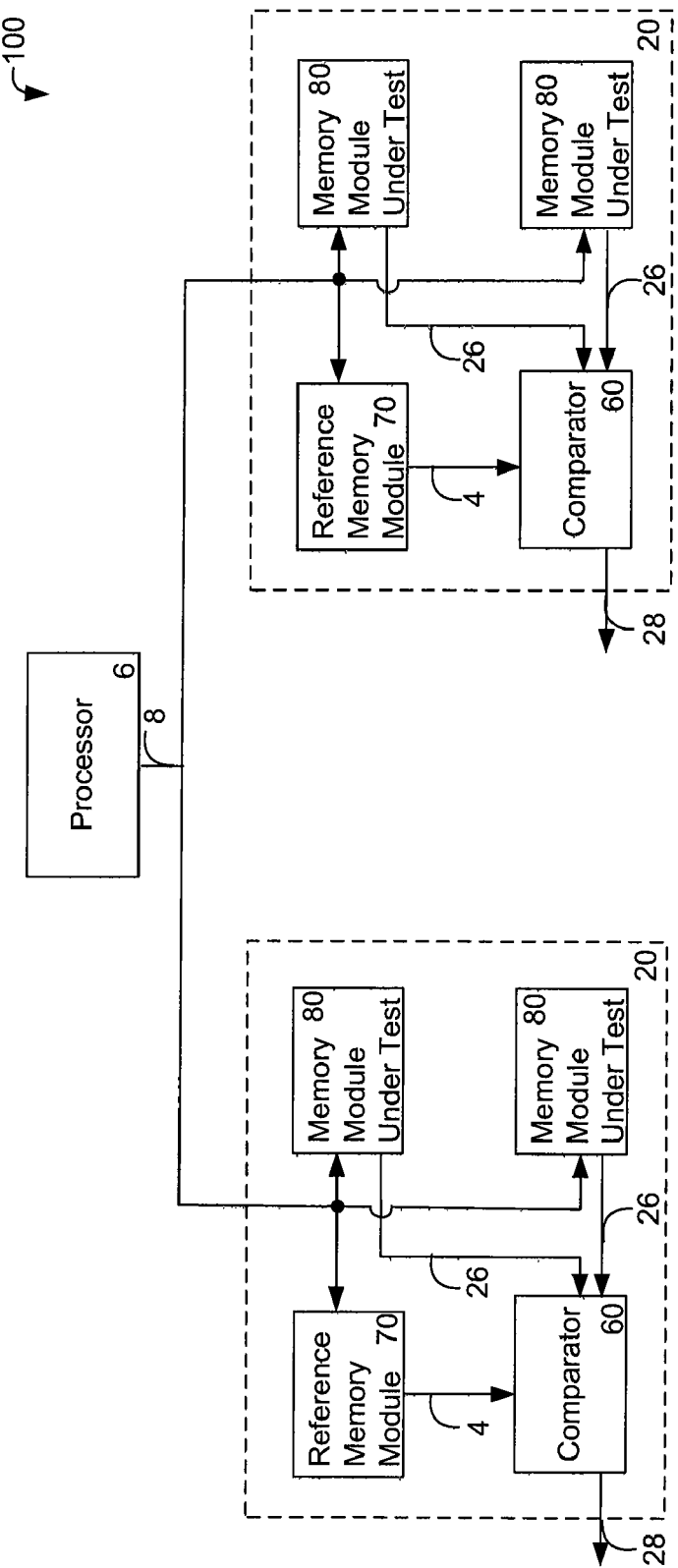
FIG. 1 is a block diagram illustrating components of a known test system for performing functional testing of a memory module.

One example of a known test system in which application-specific testing (also referred to as "behavioral testing") of integrated circuit devices is performed, is described in U.S. patent application Ser. No. 09/678,397 in the name of Lai. Behavioral testing tests memory modules in an environment representative of an actual application in which the memory modules will ultimately be used. When performing behavioral testing, a reference memory module is typically employed. The reference memory module, which typically is a memory module that has previously been tested successfully, and is of the same type as the memory modules under test, operates while an application task is being performed within the application system. Connection lines to the reference memory module inside the application system are tapped, and the data is fed to one or more of the memory modules under test. Accordingly, the same input data being provided to the reference memory module is also provided to the memory modules under test. Furthermore, output data from the reference memory module is also fed to one or more comparators, which compare the output data from the reference memory module with output data received by the comparators from the memory modules under test. If the output data from the reference memory module and the output data from the memory modules under test are exactly the same, then the memory modules under test may be considered to have passed the behavioral test. On the other hand, if the output data from the reference memory module differs from the output data from the memory modules under test, then the memory modules under test may be considered to have failed the behavioral test.

Another example of a known test system in which behavioral testing of integrated circuit devices is performed is described in U.S. Pat. No. 7,848,899 in the name of Lai et al. Among other things, this system uses two reference memory modules, each of which is typically a memory module that has previously been tested successfully, and is of the same type as the memory modules under test. The system allows for a broadening of the scope of behavioral testing and improves the testing of memory modules under test.

Behavioral testing may be able to expose errors that might not be otherwise discovered by other testing procedures (e.g. functional testing). However, providing access to data that would facilitate a detailed analysis of the specific memory errors identified when performing behavioral testing may be beyond the capacity of known behavioral testing systems.

Accordingly, embodiments described herein may provide at least some improvements over known behavioral testing systems in which memory modules are tested while operating in an application-specific environment. At least some embodiments described herein allow specific details of memory errors revealed during behavioral testing of memory modules to be further identified, examined, and stored for subsequent analysis.

To better illustrate the features of the embodiments that will be described herein with reference to FIGS. 4 and 5, certain features of known memory testing systems will first be described briefly with reference to FIGS. 1 to 3, for comparison.

Example of a Known Functional Testing System

FIG. 1 illustrates components of a known test system for performing functional testing of a memory module, shown generally as 100. Test system 100 may be used to perform functional testing of memory modules, such as memory modules under test 80.

Test system 100 comprises a processor 6 coupled to one or more testing modules 20 via a communication channel 8. Processor 6 generates test data, which is transmitted to the testing modules 20 via communication channel 8. The test data comprises test patterns to be used in testing the storage elements of memory modules under test 80.

For example, the test patterns may correspond to instructions for performing the following operations on each of the memory modules under test 80:

Sample Test Algorithm
1) From the first to last memory address, write "0";
2) From the first to last memory address, read "0", write "1";
3) From the first to last memory address, read "1", write "0"
4) From the first to last memory address, read "0".

Each testing module 20 comprises one or more memory modules under test 80, a reference memory module 70, and a comparator 60. In the example test system shown in FIG. 1, each testing module 20 comprises two memory modules under test 80. Each memory module under test 80 may comprise more than one memory device. Memory module under test 80 may comprise application-specific integrated circuit (ASIC) devices, ASIC modules comprising more than one ASIC device, or other integrated circuit devices. In test system 100, all of the memory modules under test 80 may be of the same type. Reference memory modules 70 are typically also of the same type as the memory modules under test 80, and will typically have already been thoroughly tested and confirmed as "good" devices.

In operation, each of the memory modules under test 80 and the reference memory modules 70 in test system 100 will receive the test data generated by the processor 6 via communication channel 8, and will generate response data in response. The response data generated by the memory modules under test 80 may be more specifically referred to as "test response data", whereas the response data generated by the reference memory modules 70 may be more specifically referred to as "reference response data". The reference response data and the test response data are transmitted to a comparator 60 via communication channels 4 and 26 respectively.

Each comparator 60 is configured to determine whether or not the test response data received from a memory module under test 80 matches the reference response data generated by the corresponding reference memory module 70, in response to the test data (comprising test patterns) generated by processor 6. Comparator 60 then outputs the results of comparisons onto communication channel 28, as test results. For example, if comparator 60 determines a match between the test response data received from a particular memory module under test 80 and the corresponding reference response data, then the corresponding memory module under test 80 has, at least in the context of that particular test pattern, produced valid data. On the other hand, if the test response data received from a particular memory module under test 80 and the corresponding reference response data do not match, then that memory module under test 80 may have undergone a failure of some kind.

Memory modules under test 80 might ultimately be intended for use, after completion of functional testing, in computer systems that comprise a motherboard containing a processor and a chipset, which may comprise a controller (e.g. a memory controller for example). However, during the functional testing process performed by test system 100, memory modules under test 80 are generally tested independently of other components of a computer system. Processor 6 is primarily configured to generate test patterns in accordance with specially-designed functional testing procedures, rather than to execute instructions associated with an application task that memory modules under test 80 might be exposed to when put into actual use in an application environment. Processor 6 may also be implemented in a field programmable gate array (FPGA) or an ASIC.

Examples of Known Behavioral Testing Systems

Figure 2:
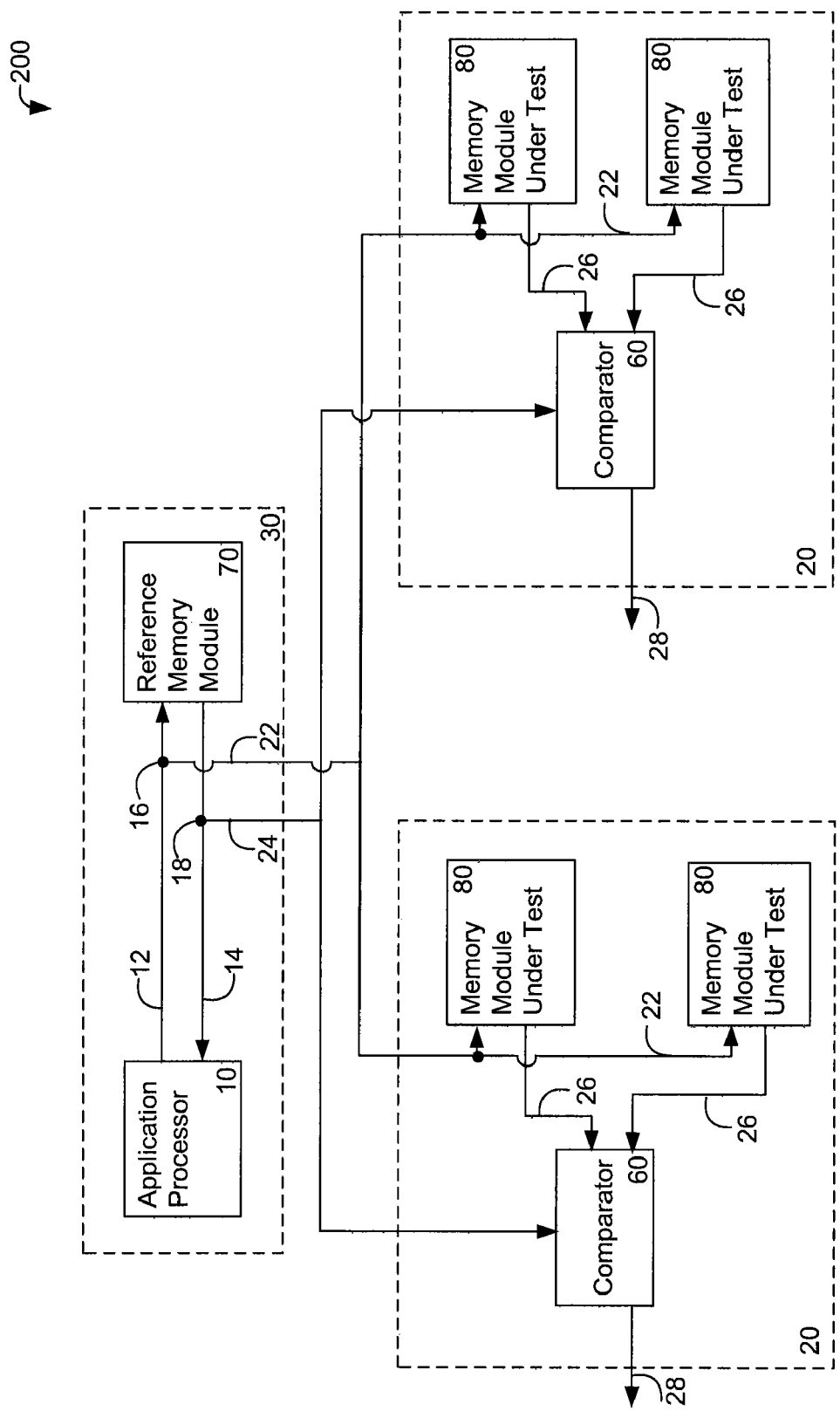
FIG. 2 is a block diagram illustrating components of a known test system for performing application-specific testing of a memory module.

FIG. 2 illustrates components of a known test system for performing application-specific testing of a memory module, shown generally as 200. Test system 200 may be used to perform behavioral testing of memory modules, such as memory modules under test 80.

Test system 200 comprises an application system 30 coupled to one or more testing modules 20. In the example test system shown in FIG. 2, test system 200 comprises two testing modules 20.

Application system 30 may comprise a system, product, equipment or device that can use the memory modules under test 80. If the memory modules under test 80 are memory devices or a memory module comprised of a number of memory devices, the application system may comprise, for example, a PC, an appliance, a video card for a PC, a digital television (TV), an MP3 player, a camera, a voice recorder, a subassembly, a server, networking equipment, a cell phone, an information appliance, or other electronic product that uses memory devices or memory modules. Application system 30 may comprise hardware and software components, and may be "off-the-shelf" or custom-designed.

In the example test system shown in FIG. 2, application system 30 comprises an application processor 10 coupled to a reference memory module 70 via a signal bus. The signal bus generally comprises one or more parallel wires, which are collectively used to transmit data signals generated by application processor 10 to reference memory module 70, and to transmit data signals generated by reference memory module 70 back to application processor 10. It will be understood that each of the wires of the signal bus may be either unidirectional or bidirectional. On wires that are unidirectional, data only flows in one direction, i.e. from application processor 10 to reference memory module 70 or from reference memory module 70 to application processor 10. On wires that are bidirectional, data may flow in either direction.

For example, where reference memory module 70 comprises double data rate synchronous dynamic random access memory (DDR SDRAM) devices, typically, the command and address wires are unidirectional and the data wires are bidirectional. However, it will be understood that the signal bus may generally comprise only unidirectional wires, only bidirectional wires, or some combination of both unidirectional and bidirectional wires.

In the illustration of FIG. 2, the signal bus used to transmit data between application processor 10 and reference memory module 70 is represented logically as two individual communication channels 12 and 14. The first communication channel 12 represents one or more wires of the signal bus on which data signals are transmitted from application processor 10 to reference memory module 70. Put another way, first communication channel 12 carries input to reference memory module 70. In contrast, the second communication channel 14 represents one or more wires of the signal bus on which data signals are received by application processor 10 from reference memory module 70. Put another way, second communication channel 14 carries output generated by reference memory module 70.

Although the signal bus is represented in the Figures as two communication channels 12, 14 carrying input to and output from the reference memory module 70, the signal bus is physically implemented by a collective set of unidirectional and/or bidirectional wires as described above. Accordingly, it will be understood that a given bidirectional wire of the signal bus may be considered as belonging to first communication channel 12 when transmitting data signals from application processor 10 to reference memory module 70, while the same bidirectional wire of the signal bus may be considered as belonging to second communication channel 14 when transmitting data signals from reference memory module 70 to application processor 10. It will be understood that the same logical representation of communication channels as represented in the Figures may also apply to other wires carrying input to and/or output from reference memory devices and/or memory devices under test.

During the normal course of operation of application system 30, application processor 10 performs an application task and generates data to be transmitted to reference memory module 70, referred to herein generally as test data. The test data is transmitted from application processor 10 to reference memory module 70 using first communication channel 12. In response to the test data received from application processor 10, reference memory module 70 generates reference response data. The reference response data is then transmitted from reference memory module 70 back to application processor 10 using second communication channel 14.

The test data generated by application processor 10 of application system 30 may comprise a series of instructions (e.g. read and write instructions), with each instruction divided into multiple data structure segments. For example, each instruction may comprise a command segment (e.g. read/write), an address segment and a data segment, where the command segment specifies whether the memory device is to read the data at, or write the data specified in the data segment to, the memory address specified in the address segment.

In some embodiments, the command segment may support other instructions in addition to read and write. For example, where the memory modules under test 80 are DDR SDRAM devices, the command segment may comprise signals associated with one or more of the following instructions, provided as examples only: read, write, refresh, bank activate and pre-charge. In other embodiments, each instruction may further comprise a clock segment, for providing a clock signal.

To facilitate application-specific testing of memory modules under test 80 in test system 200, communication channels 12 and 14 (i.e. wires of the signal bus carrying input to and output from reference memory module 70 respectively) are directly tapped using tapping connections 16 and 18 respectively. Typically, tapping connection 16 taps the same number of wires as the number of wires that comprise first communication channel 12, so that a copy of the test data transmitted via first communication channel 12 is reproduced on the tapping connection 16. Similarly, tapping connection 18 typically taps the same number of wires as the number of wires that comprise second communication channel 14, so that a copy of the reference response data transmitted via second communication channel 14 is reproduced on the tapping connection 18. Tapping connections 16 and 18 are coupled to communication channels 22 and 24, which may comprise the same number of wires as first communication channel 12 and second communication channel 14 respectively. Communication channels 22 and 24 are configured to transfer a copy of the test data and the reference response data to testing modules 20. It will be understood that some wires of communication channels 22 and 24, for example, may be bidirectional in a physical implementation of test system 200.

Each testing module 20 comprises one or more memory modules under test 80 and a comparator 60. In the example test system shown in FIG. 2, each testing module 20 comprises two memory modules under test 80. Communication channel 22 is connected to the memory modules under test 80, and is used to direct a copy of the test data, generated by application processor 10 and sent to reference memory module 70 within application system 30, to each of the memory modules under test 80. Accordingly, when test data is transmitted from application processor 10 to reference memory module 70, the test data will also be transmitted to the memory modules under test 80. For example, when the test data comprises a write command with accompanying data, data to be written to reference memory module 70 will also be written to each of the memory modules under test 80.

Similarly, where the test data comprises a read command, reference memory module 70 will output reference response data over communication channel 14 to be transmitted back to application processor 10. However, a copy of the reference response data is also redirected to comparators 60 via tapping connection 18 and communication channel 24. Since memory modules under test 80 will receive the same read command as reference memory module 70 (via tapping connection 16 and communication channel 22), each of the memory modules under test 80 will also output test response data in response to the read command. The test response data will be transferred from each of the memory modules under test 80 to a corresponding comparator 60 over a corresponding communication channel 26.

Each comparator 60 compares the test response data generated by the memory modules under test 80 to the reference response data generated by reference memory module 70, and outputs test results for each memory module under test 80 on communication channel 28. If a comparator 60 determines a match between the test response data received from a particular memory module under test 80 and the reference response data, then that memory module under test 80 has, at least in the context of that particular test data, produced valid data. On the other hand, if the test response data received from a particular memory module under test 80 and the reference response data do not match, then that memory module under test 80 may have undergone a failure or error of some kind.

Comparators 60 may comprise logic devices, such as a series of exclusive-or gates implemented using, for example, FPGAs, ASICs or other suitable components known by persons skilled in the art.

The test results output on communication channel 28 may be collected by, for example, a microcontroller [not shown]. The microcontroller may subsequently provide the test result to an output device, a data logging unit, a separate application system, a microprocessor, a display, a set of light emitting diodes (LEDs), one or more error indicators (e.g. visual indicators, aural indicators, a combination of these), or an electronic component connected to one or more of these elements, for example.

Reference memory module 70 acts as a reference device for the memory modules under test 80, as it is used to provide the expected response data (i.e. reference response data) for comparison with the response data generated by memory modules under test 80 (i.e. test response data). Therefore, the reference memory module 70 is typically a known "good", fully qualified memory module that is either the same type as the memory modules under test 80, or is functionally equivalent to the memory modules under test 80. For example, where the memory modules under test 80 comprise DDR SDRAM devices, then the reference memory module 70 typically comprises a known "good" DDR SDRAM device.

In contrast to test system 100 of FIG. 1, in test systems for performing application-specific testing of integrated circuit devices such as test system 200, the memory modules under test 80 are exposed to interactions between application processor 10 and reference memory module 70 of the application system 30 during the performance of an application task, so that the memory modules under test 80 are operated in a manner that closely replicates the actual environment in which they will likely be used.

Figure 3:
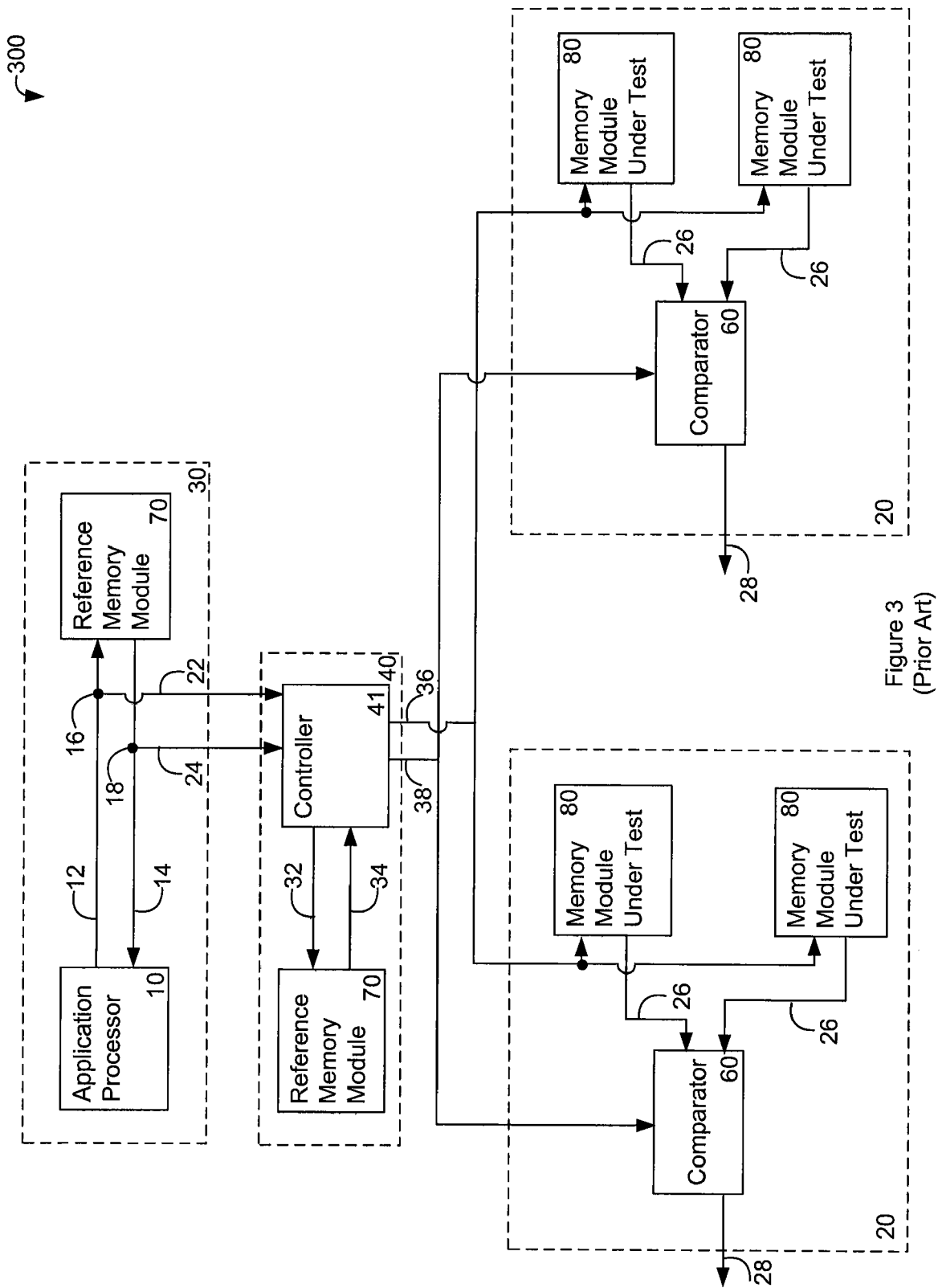
FIG. 3 is a block diagram illustrating components of another known test system for performing application-specific testing of a memory module.

FIG. 3 illustrates components of another known test system for performing application-specific testing of a memory module, shown generally as 300. Test system 300 may also be used to perform behavioral testing of memory modules, such as memory modules under test 80.

In the example test system shown in FIG. 3, test system 300 comprises a number of components that are generally analogous to components of test system 200 described with reference to FIG. 2. Similar elements are referred to using similar reference numerals, and the reader is directed to the description of FIG. 2 for further details.

Test system 300 differs in at least one aspect from test system 200 of FIG. 2, in that, for example, test system 300 comprises an additional reference module 40, which resides outside of application system 30. Reference module 40 comprises a controller 41, which as described below, is configured to, optionally, generate new test data. For example, controller 41 would allow a system operator (e.g. test engineer) to generate additional test data to substitute for certain test data that was generated by the application processor 10 of application system 30. This may provide test system 300 with greater flexibility as compared to test system 200 of FIG. 2.

As previously noted, to facilitate application-specific testing of memory modules under test 80, tapping connections to at least one communication channel within application system 30 are made. For example, first communication channel 12 is directly tapped using tapping connection 16. The tapping connection may tap the same number of wires as the number of wires that comprise first communication channel 12, so that test data transmitted via first communication channel 12 is reproduced on the tapping connection 16. However, tapping connection 16 may have fewer wires than the number of wires that comprise first communication channel 12, where it is desirable to tap only some of the wires over which test data is transmitted.

For example, where each of the wires of first communication channel 12 corresponds to a specific data segment of the test data (e.g. command segment (e.g. read/write), address segment, and data segment), only those wires corresponding to desired segments of data being transmitted within application system 30 may be tapped.

In test system 300, tapping connection 16 is coupled to communication channel 22 to transmit a copy of the test data, or the portion of the test data transmitted via first communication channel 12 that is tapped by tapping connection 16, to reference module 40. Furthermore, optionally, second communication channel 14 in application system 30 may also be tapped, using tapping connection 18. The tapping connection 18 may tap the same number of wires as the number of wires that comprise second communication channel 14, so that reference response data transmitted from reference memory module 70 via second communication channel 14 back to application processor 10 will be reproduced on tapping connection 18. Tapping connection 18 is coupled to communication channel 24 to transmit a copy of the reference response data to reference module 40. In embodiments where communication channel 14 is not tapped, tapping connection 18 and communication channel 24 may, optionally, be omitted from test system 300.

Reference module 40 comprises a second reference memory module 70 coupled to controller 41 via at least one communication channel. In this example test system, communication channels 32 and 34 are illustrated. Communication channel 32 of reference module 40 represents a signal bus (e.g. comprising one or more parallel wires) used to transfer data from controller 41 of reference module 40 to second reference memory module 70 of reference module 40. Communication channel 34 of reference module 40 represents a signal bus (e.g. comprising one or more parallel wires) used to transfer data from second reference memory module 70 of reference module 40 to controller 41. Some wires of communication channels 32 and 34 may be bidirectional.

Controller 41 may be configured to operate in one of multiple test modes. For example, controller 41 may be configured to receive a copy of the test data generated by application processor 10 of application system 30 via communication channel 22, and re-transmit the test data to second reference memory module 70 of reference module 40 via communication channel 32. In response to the test data received from controller 41, second reference memory module 70 of reference module 40 generates second reference response data. The second reference response data is transmitted from second reference memory module 70 of reference module 40 back to controller 41 using second communication channel 34. Controller 41 then transmits a copy of both the test data generated by application processor 10 of application system 30 and the second reference response data generated by second reference memory module 70 of reference module 40 to testing modules 20, using communication channels 36 and 38 respectively. Accordingly, all input to reference memory module 70 of application system 30, and the output from second reference memory module 70 of reference module 40, may be used to test the memory modules under test 80.

Alternatively, controller 41 may be configured to receive a copy of the test data generated by application processor 10 of application system 30, or a portion thereof via communication channel 22, and generate additional test data. Controller 41 may then be configured to generate new test data using at least a portion of the test data obtained from the application system 30, and the generated additional test data. For example, controller 41 may be configured to populate the command segments of the new test data with the data in the command segments of the test data generated by application processor 10 of application system 30, and to populate the address and data segments of the new test data with additional test data generated by controller 41. As a further example, controller 41 may be configured to populate the command and address segments of the new test data with the data in the command and address segments of the test data generated by the application processor 10 of application system 30, and to only populate the data segments of the new test data with additional test data generated by controller 41. Still further, where the command segment comprises signals representing multiple commands across a certain time interval, controller 41 may be configured to only populate a portion of the command segment of the new test data with the portion of the command segment of the test data generated by application processor 10 of application system 30, while generating data to populate the remaining portions of the command segment of the new test data. Once the new test data is generated by controller 41, the new test data is transmitted to second reference memory module 70 of reference module 40 using first communication channel 32. In response to the new test data received from controller 41, second reference memory module 70 of reference module 40 generates second reference response data. Second reference memory module 70 of reference module 40 transmits the second reference response data back to controller 41 using second communication channel 34. Controller 41 then transmits both the new test data generated by controller 41 and the second reference response data generated by second reference memory module 70 of reference module 40 to testing modules 20, using communication channels 36 and 38 respectively. Accordingly, some, but not all of the input to reference memory module 70 of application system 30 may be combined with additional test data generated by controller 41 of reference module 40, and may be used to test the memory modules under test 80. The output from second reference memory module 70 of reference module 40 also may be used to test the memory modules under test 80.

As a further alternative, controller 41 may be configured to receive a copy of the test data generated by application processor 10 of application system 30 and a copy of the reference response data generated by reference memory module 70 of application system 30 via communication channels 22 and 24 respectively. Controller 41 may then simply re-transmit a copy of the test data generated by application processor 10 of application system 30 and the reference response data generated by reference memory module 70 of application system 30 to the testing modules 20, using communication channels 36 and 38 respectively. In this manner, controller 41 may be configured to operate in a test mode that functions in a manner that is generally analogous to the mode of operation of test system 200 described with reference to FIG. 2, when desired.

In test system 300, each memory module under test 80 receives the test data that is output by controller 41 of reference module 40, via communication channel 36. The output of controller 41 may be either a copy of the test data generated by application processor 10 of application system 30, or new test data generated by controller 41. In response to the test data received from controller 41, each memory module under test 80 generates test response data. The test response data is transmitted from each of the memory modules under test 80 to the corresponding comparator 60 using communication channel 26. Each comparator 60 also receives reference response data from controller 41 via communication channel 38. The reference response data may have originated from reference memory module 70 of application system 30, or second reference memory module 70 of reference module 40, depending upon how controller 41 is configured. As was generally described with respect to FIG. 2, the inputs of comparator 60 may be compared to determine whether a memory module under test 80 has produced valid data or whether the memory module under test 80 has undergone a failure or error of some kind.

Improvements over Known Behavioral Testing Systems

As previously noted, behavioral testing may be able to expose errors that might not be otherwise discovered by other testing procedures (e.g. functional testing). However, providing access to data that would facilitate a detailed analysis of the specific memory errors identified when performing behavioral testing may be beyond the capacity of known behavioral testing systems. For example, known behavioral testing systems may not be capable of collecting more detailed data related to a given error, such as memory address data, test data that preceded or caused the error, test response data that preceded the error or resulted in the error, data identifying specific storage locations within memory words, or the like.

For example, in test systems 200 and 300, the output of the comparator may be generally Boolean in nature, particularly where test systems 200 and 300 are used in a production environment. For any given output of the comparator, either an error is indicated or it is not.

In contrast, at least some embodiments described herein may also allow more specific details of memory errors revealed during behavioral testing of memory modules to be identified, examined, and stored for subsequent analysis. For instance, at least some embodiments described herein may be configured to allow a system operator (e.g. test engineer), a microprocessor, or other device, to associate an error as identified by a comparator with test data that may have caused the error. This may provide a test engineer, for example, with more information regarding an error identified in a memory module. This information may be helpful for trouble-shooting purposes, and for memory manufacturing purposes.

In accordance with one broad aspect of the embodiments described herein, there is provided a testing apparatus for analyzing a memory module under test operating within an application system, wherein the memory module under test is coupled to a processor of the application system, and wherein the testing apparatus comprises: a first interface for coupling to the application system; a second interface for coupling to a reference memory module; a controller coupled to the first and second interfaces, wherein the controller is configured to: receive first test data and first test response data from the application system via the first interface, wherein the first test data comprises data transmitted to the memory module under test by the processor of the application system while the processor performs an application task, and wherein the first test response data comprises data transmitted from the memory module under test to the processor of the application system while the processor performs the application task; transmit second test data to the reference memory module via the second interface, wherein the second test data comprises at least a subset of the first test data; transmit second test response data to at least one comparator, wherein the second test response data comprises at least a subset of the first test response data; and transmit logging data to a data logging unit, wherein the logging data comprises at least a portion of one or both of the first test data and the second test data, and at least a portion of one or both of the first test response data and the second test response data; the at least one comparator, configured to: receive, from the reference memory module, reference response data generated by the reference memory module in response to the second test data transmitted to the reference memory module from the controller; receive the second test response data from the controller; compare the reference response data to the second test response data; generate at least one test result from at least one comparison of the reference response data with the second test response data; and transmit the at least one test result to the data logging unit; and the data logging unit, wherein the data logging unit is configured to: receive the logging data from the controller; receive the at least one test result from the at least one comparator; and record, in a memory, at least a subset of the logging data.

In another broad aspect, the data logging unit is further configured to record, in the memory, at least a subset of the at least one test result.

In another broad aspect, the testing apparatus further comprises the reference memory module coupled to the second interface.

In another broad aspect, the reference response data is generated by the reference memory module in response to one or more read commands in the second test data transmitted to the reference memory module from the controller.

In another broad aspect, the second test data comprises all of the first test data.

In another broad aspect, the second test response data comprises all of the first test response data.

In another broad aspect, the testing apparatus comprises a circuit board or card.

In another broad aspect, the memory module under test and the reference memory module are of a same type.

In another broad aspect, the memory module under test and the reference memory module are of a same configuration.

In another broad aspect, the testing apparatus comprises exactly one reference memory module.

In another broad aspect, the testing apparatus comprises an additional reference memory module for each additional memory module under test from which the testing apparatus receives first test data and first test response data.

In another broad aspect, the testing apparatus further comprises time-aligning circuitry, configured such that the data logging unit receives the at least one test result transmitted from the at least one comparator and the logging data transmitted from the controller simultaneously.

In another broad aspect, the controller is further configured to modify at least one of the first test data or the first test response data, when generating at least one of the second test data or the second test response data.

In another broad aspect, the controller provides an additional interface to an external device, and wherein the external device controls how the at least one of the first test data or the first test response data is modified.

In another broad aspect, the controller provides an additional interface to an external device, and wherein the external device is configured to access at least a subset of the logging data.

In another broad aspect, the at least one comparator is configured to receive the reference response data from the reference memory module via the second interface.

In another broad aspect, the at least one comparator is configured to receive the reference response data from the reference memory module via the controller.

In another broad aspect, the first test data and the second test data comprise commands, address values and data values.

In another broad aspect, the memory to which the data logging unit records data is provided by the testing apparatus.

In another broad aspect, the data logging unit is further configured to output data recorded in the memory to at least one external device.

In another broad aspect, the at least one external device comprises a microcontroller.

In another broad aspect, the memory resides on an external device, and wherein the data logging unit provides an additional interface to the external device.

In another broad aspect, the data logging unit is further configured to receive a configuration signal, wherein the configuration signal controls which portions of the logging data received from the controller are to be recorded in the memory.

In another broad aspect, for a given test cycle, the data logging unit is configured to record the at least a subset of the logging data until the at least one test result received from the comparator indicates an error.

In another broad aspect, for a given test cycle, the data logging unit is configured to record the at least a subset of the logging data until the at least one test result received from the comparator indicates a pre-specified number of errors.

In another broad aspect, the data logging unit is configured to record a given subset of the logging data corresponding to a given subset of the at least one test result if the given subset of the at least one test result indicates an error.

In another broad aspect, the data logging unit is configured to record a given subset of the logging data and a corresponding given subset of the at least one test result in the memory if the given subset of the logging data comprises a pre-specified command.

In another broad aspect, the data logging unit is configured to record a given subset of the logging data and a corresponding given subset of the at least one test result in the memory if the given subset of the logging data comprises a pre-specified memory address.

In another broad aspect, the data logging unit is configured to record a given subset of the logging data and a corresponding given subset of the at least one test result in the memory if the given subset of the logging data comprises pre-specified data of interest.

In another broad aspect, there is provided a method of analyzing a memory module under test operating within an application system, wherein the memory module under test is coupled to a processor of the application system, wherein the method comprises: a controller receiving first test data and first test response data from the application system, wherein the first test data comprises data transmitted to the memory module under test by the processor of the application system while the processor performs an application task, and wherein the first test response data comprises data transmitted from the memory module under test to the processor of the application system while the processor performs the application task; the controller transmitting second test data to a reference memory module, wherein the second test data comprises at least a subset of the first test data; the controller transmitting second test response data to at least one comparator, wherein the second test response data comprises at least a subset of the first test response data; the controller transmitting, to a data logging unit, logging data, wherein the logging data comprises at least a portion of one or both of the first test data and the second test data, and at least a portion of one or both of the first test response data and the second test response data; the at least one comparator receiving, from the reference memory module, reference response data generated by the reference memory module in response to the second test data transmitted to the reference memory module from the controller; the at least one comparator receiving the second test response data from the controller; the at least one comparator comparing the reference response data to the second test response data; the at least one comparator generating at least one test result from at least one comparison of the reference response data with the second test response data; the at least one comparator transmitting the at least one test result to the data logging unit; the data logging unit receiving the logging data from the controller; the data logging unit receiving the at least one test result from the at least one comparator; and the data logging unit recording, in a memory, at least a subset of the logging data.

In another broad aspect, there is provided a testing apparatus for analyzing a memory module under test, wherein the testing apparatus comprises: a first interface for coupling to an application system; a second interface for coupling the memory module under test; a controller coupled to the first and second interfaces, wherein the controller is configured to: receive first test data and first reference response data from the application system via the first interface, wherein the first test data comprises data transmitted to a reference memory module, operating within an application system, by a processor of the application system while the processor performs an application task, and wherein the first reference response data comprises data transmitted from the reference memory module to the processor of the application system while the processor performs the application task; transmit second test data to the memory module under test via the second interface, wherein the second test data comprises at least a subset of the first test data; transmit second reference response data to at least one comparator, wherein the second reference response data comprises at least a subset of the first reference response data; and transmit logging data to a data logging unit, wherein the logging data comprises at least a portion of one or both of the first test data and the second test data, and at least a portion of one or both of the first reference response data and the second reference response data; the at least one comparator, configured to: receive, from the memory module under test, test response data generated by the memory module under test in response to the second test data transmitted to the memory module under test from the controller; receive the second reference response data from the controller; compare the test response data to the second reference response data; generate at least one test result from at least one comparison of the test response data with the second reference response data; and transmit the at least one test result to the data logging unit; and the data logging unit, wherein the data logging unit is configured to: receive the logging data from the controller; receive the at least one test result from the at least one comparator; and record, in a memory, at least a subset of the logging data.

Figure 4:
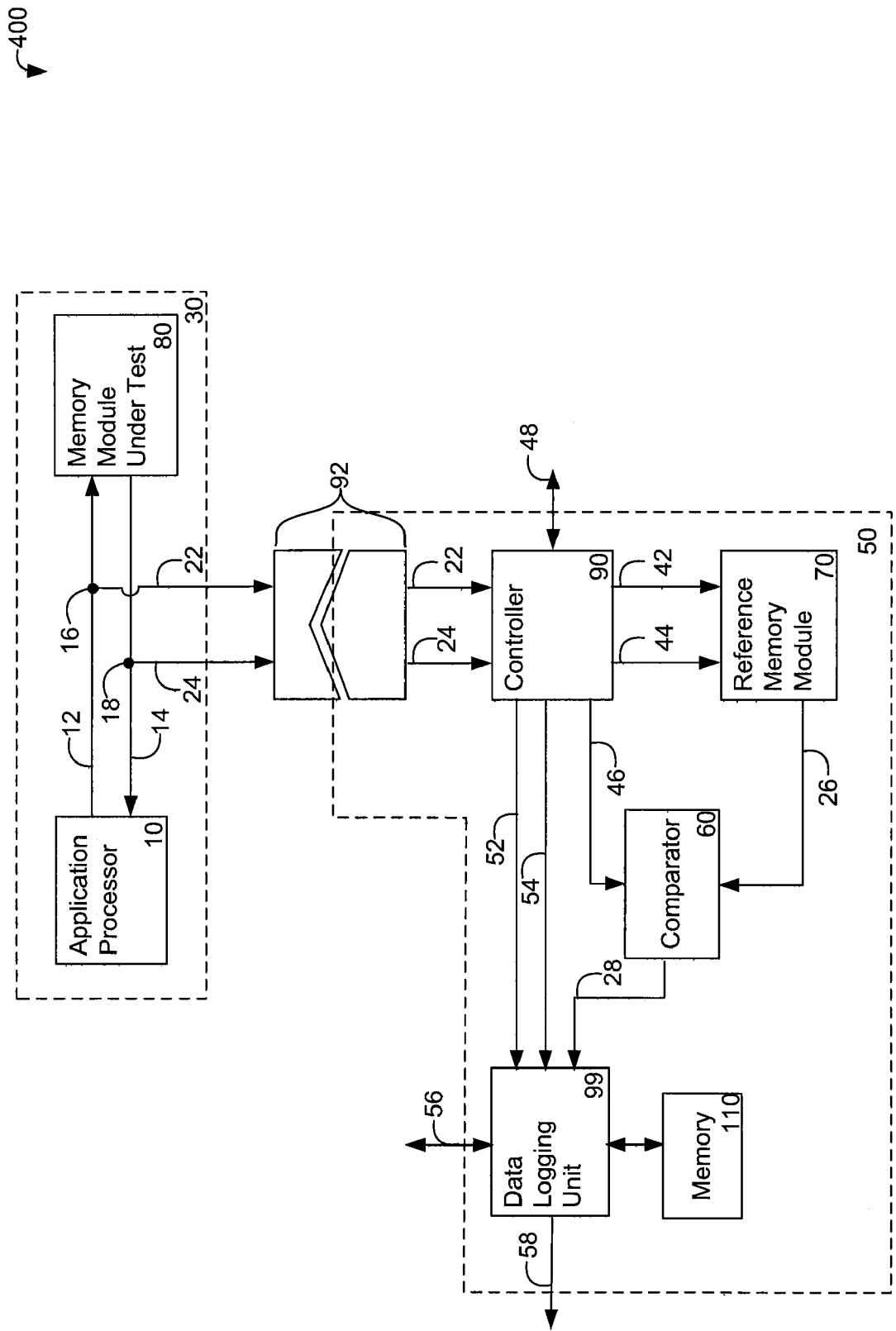
FIG. 4 is a block diagram of a system comprising a testing apparatus for analyzing a memory module operating within an application system, in accordance with at least one embodiment.

Reference is now made to FIG. 4, in which a system comprising a testing apparatus for analyzing a memory module operating within an application system, in accordance with at least one embodiment, is shown generally as 400.

Similar to test systems 200 and 300 of FIGS. 2 and 3 respectively, test system 400 comprises an application system 30. Application system 30 may comprise a system, product, equipment or device that can use the memory modules under test 80. If the memory modules under test 80 are memory devices or a memory module comprised of a number of memory devices, the application system may comprise, for example, a PC, an appliance, a video card for a PC, a digital TV, an MP3 player, a camera, a voice recorder, a subassembly, a server, networking equipment, a cell phone, an information appliance, or other electronic product that uses memory devices or memory modules. Application system 30 may comprise hardware and software components, and may be "off-the-shelf" or custom-designed.

In the example test system shown in FIG. 4, application system 30 comprises an application processor 10 coupled to a memory module under test 80 via a signal bus. The signal bus generally comprises one or more parallel wires, which are collectively used to transmit data signals generated by application processor 10 to memory module under test 80, and to transmit data signals generated by memory module under test 80 back to application processor 10. It will be understood that each of the wires of the signal bus may be either unidirectional or bidirectional. On wires that are unidirectional, data only flows in one direction, i.e. from application processor 10 to memory module under test 80 or from memory module under test 80 to application processor 10. On wires that are bidirectional, data may flow in either direction.

For example, where memory module under test 80 comprises DDR SDRAM devices, typically, the command and address wires are unidirectional and the data wires are bidirectional. However, it will be understood that the signal bus may generally comprise only unidirectional wires, only bidirectional wires, or some combination of both unidirectional and bidirectional wires.

It may be observed that in one aspect of test system 400, the memory module under test 80 is provided within application system 30, rather than the reference memory module 70 being provided within application system 30. In test system 400, the reference memory module 70 is provided on a testing apparatus 50, which is separate from application system 30. This may make the testing apparatus more portable. However, in variant embodiments, the placements of reference memory module 70 and memory module under test 80 as shown in FIG. 4 may be switched, such that reference memory module 70 is provided within application system 30 and memory module under test 80 is provided by testing apparatus 50.

In one embodiment, reference memory module 70 is identical to memory module under test 80, in that they are both of the same type and of the same configuration. Providing a reference memory module 70 that is identical to the memory module under test 80 may improve the accuracy of the test results to be stored for analysis. In a variant embodiment, reference memory module 70 may be a "better" module than memory module under test 80, in that the reference memory module may have a larger storage capacity (e.g. bigger memory size) or higher performance characteristics (e.g. higher frequency, lower latency time, lower set-up time), for example. Other reference memory modules may be employed in variant embodiments; however, reference memory module 70 will typically be of the same type as memory module under test 80 (e.g. DDR2, DDR3) to better ensure accurate test results.

In at least one embodiment, test system 400 comprises exactly one memory module under test 80 (e.g. to operate within application system 30) and exactly one corresponding reference memory module 70 (e.g. to operate on testing apparatus 50). In variant embodiments, test system 400 may comprise multiple memory modules under test. However, in one broad aspect, one additional reference memory module is provided for each additional memory module under test in test system 400. In contrast to the specific example configurations of behavioral testing systems of FIGS. 2 and 3, at least some embodiments of test system 400 provide a one-to-one correspondence between a given memory module under test 80 and a reference memory module 70. Such an arrangement may permit signals to travel shorter distances during testing, as compared to some known behavioral testing systems. This arrangement may be beneficial, particularly where memory modules are being tested at high speed using high-frequency testing signals. Generally, during behavioral testing, connection lines to memory modules are tapped and the tapped data is fed to one or more other memory modules. However, when high-frequency signals are transmitted across connection lines, signal integrity can deteriorate quickly. By employing a configuration where signals travel shorter distances, signal integrity may be better preserved during testing, and this may result in an improvement in the quality of test results.

Memory module under test 80 in test system 400 may be a memory module that has been previously tested and found to be at fault. Embodiments of test apparatus 50 and of methods of analyzing memory modules described herein may then be utilized to determine the cause of the failure. However, previously untested memory modules may also be employed as memory module under test 80 in test system 400, where desired.

Referring again to FIG. 4, the signal bus used to transmit data between application processor 10 and memory module under test 80 may be represented logically as two individual communication channels 12 and 14. The first communication channel 12 represents one or more wires of the signal bus on which data signals are transmitted from application processor 10 to memory module under test 80. Put another way, first communication channel 12 carries input to memory module under test 80. In contrast, the second communication channel 14 represents one or more wires of the signal bus on which data signals are received by application processor 10 from memory module under test 80. Put another way, second communication channel 14 carries output generated by memory module under test 80. Although the signal bus is represented as two communication channels 12, 14 carrying input to and output from memory module under test 80, the signal bus is physically implemented by a collective set of unidirectional and/or bidirectional wires as described above. Accordingly, it will be understood that a given bidirectional wire of the signal bus may be considered as belonging to first communication channel 12 when transmitting data signals from application processor 10 to memory module under test 80, while the same bidirectional wire of the signal bus may be considered as belonging to second communication channel 14 when transmitting data signals from memory module under test 80 to application processor 10.

During the normal course of operation of application system 30, application processor 10 performs an application task and generates data to be transmitted to memory module under test 80, referred to herein generally as test data, as noted previously. The test data is transmitted from application processor 10 to memory module under test 80 using first communication channel 12. Subsequently, in response to the test data received from application processor 10, memory module under test 80 generates test response data. The test response data is then transmitted from memory module under test 80 back to application processor 10 using second communication channel 14.

Persons skilled in the art will understand that the above-mentioned "data signals" that are transmitted on the signal bus as previously described, are not limited to representations of actual "data" being written to or read from the memory module under test 80. For example, the test data generated by application processor 10 of application system 30 that is transmitted on the signal bus may comprise a series of instructions (e.g. read and write instructions), with each instruction divided into multiple data structure segments. For example, each instruction may comprise a command segment (e.g. read/write), an address segment and a data segment, where the command segment specifies whether the memory device is to read the data at, or write the data specified in the data segment to, the memory address specified in the address segment.

In some embodiments, the command segment may support other instructions in addition to read and write. For example, where the memory modules under test 80 are DDR SDRAM devices, the command segment may comprise signals associated with one or more of the following instructions, provided as examples only: read, write, refresh, bank activate and pre-charge. In other embodiments, each instruction may further comprise a clock segment, for providing a clock signal.

To facilitate application-specific testing of memory modules under test 80 in test system 400, communication channels 12 and 14 (i.e. wires of the signal bus carrying input to and output from memory module under test 80 respectively) are directly tapped using tapping connections 16 and 18 respectively. Typically, tapping connection 16 taps the same number of wires as the number of wires that comprise first communication channel 12, so that a copy of the test data transmitted via first communication channel 12 is reproduced on the tapping connection 16.

However, fewer wires may be tapped. For example, tapping connection 16 may tap the same number of wires as the number of wires that comprise the address segment, so that the address segment of the test data transmitted via first communication channel 12 is reproduced on the tapping connection 16. Tapping connection 16 may alternatively, or additionally, tap the same number of wires as the number of wires that comprise the command segment, so that the command signals of the test data transmitted via first communication channel 12 may be reproduced on the tapping connection 16. Tapping connection 16 may alternatively, or additionally, tap the same number of wires as the number of wires that comprise the data segment, so that the data segment of the test data transmitted via first communication channel 12 to be written to memory module under test 80 may be reproduced on the tapping connection 16.

Similarly, tapping connection 18 typically taps the same number of wires as the number of wires that comprise second communication channel 14, so that a copy of the test response data transmitted via second communication channel 14 is reproduced on tapping connection 18. However, fewer wires may be tapped. For example, tapping connection 18 may tap the same number of wires as the number of wires that comprise the data segment (or part thereof), so that the data segment (or part thereof) of the test response data transmitted via second communication channel 14 from memory module under test 80 may be tapped.

Tapping connections 16 and 18 are coupled to communication channels 22 and 24, which may comprise the same number of wires as first communication channel 12 and second communication channel 14 respectively. Communication channels 22 and 24 are configured to transfer a copy of the test data and the test response data to testing apparatus 50. It will be understood that some wires of communication channels 22 and 24, for example, may be bidirectional in a physical implementation of test system 400.

Communication channels 22 and 24 may be implemented by physically connecting wires between application system 30 and testing apparatus 50. However, in at least one embodiment, an interface 92 may be provided on testing apparatus 50 for coupling with a corresponding interface 92 provided by application system 30, to permit application system 30 and testing apparatus 50 to be coupled and de-coupled. This may make testing apparatus 50 more portable, which may increase convenience. A pair of interfaces 92 may comprise, for example a pair of male and female connections, a socket for receiving a circuit board or card and a corresponding insert, or other means (e.g. spring-loaded contact connectors) as are known in the art.

Components of testing apparatus 50 may be provided on one or more circuit boards or cards. In one embodiment, all components of testing apparatus 50 may be provided on a single circuit board or card, which may increase portability and convenience.

In at least one embodiment, testing apparatus 50 comprises a controller 90, a reference memory module 70, at least one comparator 60, and a data logging unit 99. When testing apparatus 50 is coupled to application system 30 (e.g. via interface 92), connections are formed such that controller 90 receives test data and test response data from application system 30 via communication channels 22 and 24 while application processor 10 of application system 30 performs an application task. The test data and test response data received from application system 30 by controller 90 via interface 92 may comprise commands, read and/or write data values, and/or address values, for example.

Generally, controller 90 is configured to direct a copy of at least some of the test data and test response data it receives from application system 30 to reference memory module 70, via at least communication channels 42 and 44. Other communication channels [not shown] may be employed in the coupling between controller 90 and reference memory module 70. Testing apparatus 50 may provide an interface [not shown] to reference memory module 70, via which other components of testing apparatus 50 may be coupled to reference memory module 70. Accordingly, in at least one embodiment, reference memory module 70 may be removable from testing apparatus 50. However, in variant embodiments, reference memory module 70 may be permanently affixed to testing apparatus 50.

In one embodiment, controller 90 is configured to transmit all of the test data received from application system 30 to reference memory module 70, via the interface to reference memory module 70. In variant embodiments, controller 90 may be configured to transmit only a strict subset of the test data received from application system 30 to reference memory module 70 via the interface to reference memory module 70.

In FIG. 4, for illustrative purposes, communication channel 42 logically represents wires carrying commands and address values in the transmitted test data, and communication channel 44 logically represents wires carrying data values in the transmitted test data to be written to reference memory module 70. In one embodiment, the number of wires in communication channel 42 may be the same as the number of wires carrying commands and/or address values to memory module under test 80 in the signal bus of application system 30, and the number of wires in communication channel 44 may be the same as the number of wires carrying data values to be written to memory module under test 80 in application system 30.

When data of an address segment of test data is transmitted from application processor 10 to memory module under test 80 within application system 30, the data of the address segment may also be transmitted to reference memory module 70 of testing apparatus 50 via controller 90 and communication channel 42. Similarly, when data of a data segment of test data is transmitted from application processor 10 to memory module under test 80 within application system 30, the data of the data segment of test data may also be transmitted to reference memory module 70 of testing apparatus 50 via controller 90 and communication channel 44.

By way of a further operational example, when application processor 10 transmits test data comprising a write command and accompanying data to memory module under test 80 within application system 30, data to be written to the memory module under test 80 may also be written to the reference memory module 70. Similarly, when application processor 10 transmits test data comprising a read command, memory module under test 80 will output data over communication channel 14 to be transmitted back to application processor 10. However, a copy of the read command and data read from memory module under test 80 is also redirected to controller 90 of testing apparatus 50, via tapping connections 16, 18, communication channels 22, 24, and interface 92. Since reference memory module 70 will receive the same read command as memory module under test 80 in the test data received from controller 90, reference memory module 70 will generate its own reference response data in response to the read command. The reference response data generated by reference memory module 70 is transmitted to comparator 60.

In the example of FIG. 4, comparator 60 will receive the reference response data from reference memory module 70 directly, via the interface to the reference memory module and communication channel 26. However, in variant embodiments, comparator 60 may receive the reference response data from reference memory module 70 indirectly via controller 90, wherein the reference response data is sent back to controller 90 by reference memory module 70 to be relayed (typically, but not necessarily in an unmodified form) to comparator 60 [flows and connections not shown].

Controller 90 is also coupled to comparator 60, via communication channel 46. In one embodiment, the number of wires in communication channel 46 may be the same as the number of wires carrying data values to be read from memory module under test 80 in application system 30. When data read from memory module under test 80 is transmitted from memory module under test 80 to application processor 10 within application system 30, a copy of this test response data may also be transmitted by controller 90 to comparator 60, via communication channel 46. Communication channel 26, via which reference response data from reference memory module 70 is transmitted to comparator 60, may comprise the same number of wires as communication channel 46.

In one embodiment, controller 90 is configured to transmit all of the test response data received from application system 30 to comparator 60 via communication channel 46. In variant embodiments, controller 90 may be configured to transmit only a strict subset of the test response data received from application system 30 to comparator 60 via communication channel 46.

Similar to the manner in which comparator 60 is configured to compare test response data and reference response data in test systems 200 and 300, comparator 60 of testing apparatus 50 is configured to compare the test response data provided by controller 90 (which in at least one embodiment, is the same test response data generated by memory module under test 80 as received by controller 90) to the reference response data generated by reference memory module 70.

At least one test result is generated in response to the comparison, and the at least one test result is transmitted to a data logging unit 99 via communication channel 28, in accordance with embodiments described herein. If comparator 60 determines a match between the test response data received from controller 90 and the reference response data received from reference memory module 70, then memory module under test 80 has, at least in the context of the test of the memory address from which data is being read from the memory modules, produced valid data. On the other hand, if the test response data received from controller 90 and the reference response data received from reference memory module 70 do not match, then memory module under test 80 may have undergone a failure of some kind.

As previously noted, comparator 60 may comprise logic devices, such as a series of exclusive-or gates implemented using, for example, FPGAs, ASICs or other suitable components known by persons skilled in the art. Also, as previously noted, reference memory module 70 acts as a reference device for memory module under test 80, as it is used to provide the expected response data (i.e., read data) for comparison with the response data (i.e., read data) generated by memory module under test 80. Therefore, reference memory module 70 is typically a known "good", fully qualified memory module that may be identical to or, typically, at least of the same type as memory module under test 80.

For the duration of a given test cycle, comparator 60 outputs test results to data logging unit 99 via communication channel 28. However, to give context to these test results and to facilitate further analysis of test results, controller 90 is also coupled to data logging unit 99 via communication channels 52 and 54, and provides data to data logging unit 99. Commands and address values may be transmitted via communication channel 52, and data values may be transmitted via communication channel 54, for example.

In general, in at least one embodiment, controller 90 is configured to transmit data comprising at least a portion of test data received from application system 30 and used to test reference memory module 70, as well as at least a portion of corresponding test response data received from application system 30 that is to be compared with the reference response data, to data logging unit 99, which may also be referred to as an "error logging unit". The data sent by controller 90 to data logging unit 99 is also referred to herein, in the specification and in the claims, generally as "logging data".

Data logging unit 99 is configured to receive logging data from controller 90, and may, but need not store all of the logging data received, depending on the specific configuration of data logging unit 99. Data logging unit 99 is also configured to receive test results output from comparator 60, and may store all, some or none of the test results received, depending on the specific configuration of data logging unit 99. Time-aligning circuitry [not shown] may also be provided in testing apparatus 50 so that data logging unit 99 may receive the logging data and test results simultaneously, or at least in a manner that will permit data logging unit 99 to associate a given test result with corresponding logging data (e.g. test data, test response data, or both).

For example, data logging unit 99 may be configured to associate one or more test results that indicate an error with specific address values, and to store at least these address values. This data may then be analyzed to aid in a determination of which storage locations inside memory module under test 80 may be defective.

Data logging unit 99 may be configured to record at least a subset of logging data in a memory. Memory 110 may be provided on testing apparatus 50, for this purpose. Associated test results provided by comparator 60 may, optionally, also be recorded, if data logging unit 99 is so configured.

In some embodiments, memory 110 may be removable and replaced with different memory. In other embodiments, memory 110 may be permanently affixed to testing apparatus 50. Still further, in variant embodiments, memory 110 may reside on an external device coupled to testing apparatus 50.

Data recorded in memory (e.g. memory 110) by data logging unit 99 may be retrieved and output on communication channel 58, where the data can be read by an external device or by a software module.

In one embodiment, the output on communication channel 58 may be received by, for example, a microcontroller [not shown]. The microcontroller may subsequently provide the test result to an output device, a data logging unit, a separate application system, a microprocessor, a display, a set of LEDs, one or more error indicators (e.g. visual indicators, aural indicators, a combination of these), or an electronic component connected to one or more of these elements, for example.

In one embodiment, data logging unit 99 is configured to receive a configuration signal via communication channel 56. The configuration signal can be provided by a user or a software application for example, to control the operation of data logging unit 99. In one embodiment, the configuration signal may be used to control which portions of the logging data received from controller 90 are to be recorded (e.g. in memory 110), and under what conditions. For example, data logging unit 99 may be configured to record all memory addresses and/or data in a given test cycle until an error is detected by comparator 60, or until a pre-defined number of errors (e.g. which may be identified in the configuration signal) is detected. As a further example, data logging unit 99 may record memory addresses and/or data only when associated with an error as detected by comparator 60. As further examples, data logging unit 99 may record memory addresses and/or data when the logging data comprises: a pre-specified command (e.g. which may be identified in the configuration signal), a pre-specified memory address (e.g. which may be identified in the configuration signal), particular pre-specified data of interest (e.g. which may be identified in the configuration signal), or some combination of these. Data logging unit 99 may be subject to other configurations, in variant embodiments.

In the above examples, controller 90 is generally configured to retransmit test data and test response data received from application system 30 to reference memory module 70 and comparator 60 respectively, without modification. However, in variant embodiments, the test data received by controller 90 from application system 30 may be different from the test data that controller 90 transmits to reference memory module 70. Similarly, in variant embodiments, the test response data received by controller 90 from application system 30 may be different from the test response data that controller 90 transmits to comparator 60. In some implementations of these variant embodiments, controller 90 may be configured to modify the test data and/or the test response data received from application system 30. The modifications performed may, depending on the configuration of controller 90, be generally analogous to the manner in which controller 41 modifies data received from application system 30 in test system 300 of FIG. 3, insofar as the controller may substitute data associated with certain segments of test data in order to generate new test data for subsequent transmission, and also insofar as the controller may, optionally, subsequently transmit test response data that is different from the test response data received from application system 30. For example, controller 90 may introduce deliberate errors into the test data and/or the test response data to verify the operation of testing apparatus 50. Controller 90 may be configured to perform such modifications, as controlled by an external device such as a logic analyzer [not shown]. Controller 90 may provide an additional interface to a communication channel 48, which couples testing apparatus 50 to the external device.

In variant embodiments, controller 90 may be configured to provide access to data that it receives from application system 30, or that it transmits to other components of testing apparatus 50, to an external device via communication channel 48.

Reference is now made to FIGS. 5A to 5C, in which flowcharts illustrating acts performed in a method of testing a memory module in accordance with at least one embodiment referred to generally as 500, are shown. Some of the features associated with acts of method 500 have been previously described with reference to FIG. 4, and the reader is directed to the earlier parts of the present description for further details.

At 502, a controller (e.g. controller 90 of FIG. 4) receives first test data and first test response data from an application system (e.g. application system 30 of FIG. 4). The first test data and first test response data may be tapped from communication channels (e.g. communication channels 12 and 14 of FIG. 4) between an application processor (e.g. application processor 10 of FIG. 4) and a memory module under test (e.g. memory module under test 80 of FIG. 4) of the application system. The application processor and the memory module under test operate within the application system, where the first test data is generated by the application processor while the application processor performs an application task, and where the first test response data comprises data transmitted by the memory module under test to the application processor in response to the first test data generated by the application processor, while the application processor performs the application task.

At 506, the controller transmits second test data based on the first test data received by the controller at 502 to a reference memory module (e.g. reference memory module 70 of testing apparatus 50 of FIG. 4). In at least one embodiment, the second test data is the same as the first test data. In at least one other embodiment, the second test data may be modified first test data (generated or received at 504), comprising at least a subset of the first test data as well as additional test data as generated by the controller (or as received by the controller from an external device).

If the second test data is the same as the first test data, then both the reference memory module and the memory module under test will receive the same test data. For example, if the first and second test data comprise the same write command, then both the reference memory module and the memory module under test will write the same data to memory.

At 508, the controller transmits second test response data generated by the controller of the testing apparatus, to a comparator (e.g. comparator 60 of testing apparatus 50 of FIG. 4). In at least one embodiment, the second test response data is the same as the first test response data. In at least one other embodiment, the second test response data may be a modified version of the first test response data [step not shown].

At 510, the controller transmits logging data to a data logging unit (e.g. data logging unit 99 of FIG. 4). The logging data may comprise, for example, at least a portion of one or both of the first test data and the second test data, and at least a portion of one or both of the first test response data and the second test response data. In variant embodiments, logging data may comprise any combination of first test data, second test data (e.g. if different from first test data), first test response data, second test response data (e.g. if different from first test response data), or portions of one or more of these.

Persons skilled in the art will understand that acts 506, 508, 510 need not be performed sequentially in the order shown. They may be performed generally concurrently, with appropriate time-aligning elements employed to ensure proper associations between tests and test responses.

Referring now to FIG. 5B, at 512, the comparator receives reference response data from a reference memory module (e.g. reference memory module 70 of FIG. 4). In operation, reference response data is generated by the reference memory module in response to the second test data transmitted thereto by the controller.

At 514, the comparator receives second test response data from the controller.

Persons skilled in the art will understand that acts 512 and 514 will generally not be performed sequentially. Reception of the reference response data will generally be time-aligned with the reception of the corresponding second test response data to ensure that the comparator makes a proper comparison.

At 516, the comparator compares the reference response data to the second test response data to determine if there is a match.

At 518, the comparator generates at least one test result from at least one comparison of the reference response data with the second test response data. For example, if the comparator determines that the second test response data received from the controller matches the reference response data, then a corresponding test result may indicate that no error has occurred with respect to the comparison. On the other hand, where the second test response data and the reference response data do not match, then the corresponding test result may indicate that an error has occurred with respect to the comparison.

At 520, the comparator transmits the at least one test result to the data logging unit.

Referring now to FIG. 5C, at 522, a data logging unit (e.g. data logging unit 99 of FIG. 4) receives the logging data from the controller, and at 524, the data logging unit receives at least one test result from the comparator (e.g. via communication channel 28).

Persons skilled in the art will understand that acts 522 and 524 will generally not be performed sequentially. Reception of the logging data will generally be time-aligned with the reception of the corresponding test result to ensure that proper associations are made between the logging data and test results received by the data logging unit. Other mechanisms that will permit logging data to be associated with test results received may be employed.

At 526, the data logging unit records, in a memory (e.g. memory 110 in FIG. 4), at least a subset of the logging data, and optionally, at least a subset of the at least one test result.

In some embodiments, the data logging unit configuration settings may be set [act not shown] to specify the type of logging data (e.g. memory address location data) to be recorded to memory under certain specified conditions, as previously described herein.

Multiple iterations of method 500 may be performed in a given test cycle, until some terminating condition is satisfied (e.g. an error, or a pre-specified number of errors is detected).

It will be understood by persons skilled in the art that some wires carrying the address, the input data to and/or the output data from either the reference memory module or the memory module under test can be shared in a physical implementation of a test system. For example, in a physical implementation of the test system 400, some functionality of the controller 90, the comparator 60, and the data logging unit 99 may be integrated together into one physical device. For example, the functionality of a controller, comparator, and data logging unit may be provided by an FPGA, an ASIC, or other suitable component.

It will be further understood by persons skilled in the art that testing apparatus 50 may contain additional controllers [not shown] coupled to the reference memory module 70, which can be implemented in one or more standalone components. The functionality of the additional controllers may alternatively be integrated with the comparator 60, for example.

It will be further understood by persons skilled in the art that the functionality of certain components in the test systems described herein need not be provided by a single physical component, but may be provided by multiple components. For example, the functionality of a comparator may be provided by a single component or multiple electronic components. Similarly, the functionality of a controller may be provided by a single component or multiple electronic components.

It will further be understood by persons skilled in the art that the test systems described herein may comprise additional components (e.g., in the application system and/or the testing apparatus) that have not been explicitly described or illustrated in the Figures for ease of exposition. It will be understood that such components are not critical to the understanding of the embodiment described herein, but may be employed in a physical implementation thereof.

It will be further understood by persons skilled in the art that the testing apparatus described herein may comprise additional synchronous and/or asynchronous delay elements, such as fixed-length or variable-length buffers, and/or other elements for the purposes of time management, either within a separate component in the test system or integrated within a component of the testing apparatus (e.g., within a controller and/or a comparator), to ensure that the comparisons of test response data and reference response data are accurate.

It will be further understood by persons skilled in the art that although the testing apparatus described herein, by way of illustration, depict all components of the testing apparatus as residing outside of an application system, one or more components of the testing card may be provided within an application system in variant embodiments.

The embodiments described herein have been shown and described by way of a number of examples. It will be apparent to those skilled in the art that changes and modifications to the described embodiments may be made without departing from the substance and scope of the described embodiments.

The invention claimed is:

1. A testing apparatus for analyzing a memory module under test operating within an application system, wherein the memory module under test is coupled to a processor of the application system, and wherein the testing apparatus comprises:
    a first interface for coupling to the application system;
    a second interface for coupling to a reference memory module;
    a controller coupled to the first and second interfaces, wherein the controller is configured to:
        receive first test data and first test response data from the application system via the first interface, wherein the first test data comprises data transmitted to the memory module under test by the processor of the application system while the processor performs an application task, and wherein the first test response data comprises data transmitted from the memory module under test to the processor of the application system while the processor performs the application task;
        transmit second test data to the reference memory module via the second interface, wherein the second test data comprises at least a subset of the first test data;
        transmit second test response data to at least one comparator, wherein the second test response data comprises at least a subset of the first test response data; and
        transmit logging data to a data logging unit, wherein the logging data comprises at least a portion of one or both of the first test data and the second test data, and at least a portion of one or both of the first test response data and the second test response data;
    the at least one comparator, configured to:
        receive, from the reference memory module, reference response data generated by the reference memory module in response to the second test data transmitted to the reference memory module from the controller;
        receive the second test response data from the controller;
        compare the reference response data to the second test response data;
        generate at least one test result from at least one comparison of the reference response data with the second test response data; and
        transmit the at least one test result to the data logging unit;
    and the data logging unit, wherein the data logging unit is configured to:
        receive the logging data from the controller;
        receive the at least one test result from the at least one comparator; and
        record, in a memory, at least a subset of the logging data.

2. The testing apparatus of claim 1, wherein the data logging unit is further configured to record, in the memory, at least a subset of the at least one test result.

3. The testing apparatus of claim 1, further comprising the reference memory module coupled to the second interface.

4. The testing apparatus of claim 1, wherein the reference response data is generated by the reference memory module in response to one or more read commands in the second test data transmitted to the reference memory module from the controller.

5. The testing apparatus of claim 1, wherein the second test data comprises all of the first test data.

6. The testing apparatus of claim 1, wherein the second test response data comprises all of the first test response data.

7. The testing apparatus of claim 1, wherein the testing apparatus comprises a circuit board or card.

8. The testing apparatus of claim 1, wherein the memory module under test and the reference memory module are of a same type.

9. The testing apparatus of claim 8, wherein the memory module under test and the reference memory module are of a same configuration.

10. The testing apparatus of claim 1, wherein the testing apparatus comprises exactly one reference memory module.

11. The testing apparatus of claim 1, wherein the testing apparatus comprises an additional reference memory module for each additional memory module under test from which the testing apparatus receives first test data and first test response data.

12. The testing apparatus of claim 1, further comprising time-aligning circuitry, configured such that the data logging unit receives the at least one test result transmitted from the at least one comparator and the logging data transmitted from the controller simultaneously.

13. The testing apparatus of claim 1, wherein the controller is further configured to modify at least one of the first test data or the first test response data, when generating at least one of the second test data or the second test response data.

14. The testing apparatus of claim 13, wherein the controller provides an additional interface to an external device, and wherein the external device controls how the at least one of the first test data or the first test response data is modified.

15. The testing apparatus of claim 1, wherein the controller provides an additional interface to an external device, and wherein the external device is configured to access at least a subset of the logging data.

16. The testing apparatus of claim 1, wherein the at least one comparator is configured to receive the reference response data from the reference memory module via the second interface.

17. The testing apparatus of claim 1, wherein the at least one comparator is configured to receive the reference response data from the reference memory module via the controller.

18. The testing apparatus of claim 1, wherein the first test data and the second test data comprise commands, address values and data values.

19. The testing apparatus of claim 1, wherein the memory to which the data logging unit records data is provided by the testing apparatus.

20. The testing apparatus of claim 19, wherein the data logging unit is further configured to output data recorded in the memory to at least one external device.

21. The testing apparatus of claim 20, wherein the at least one external device comprises a microcontroller.

22. The testing apparatus of claim 1, wherein the memory resides on an external device, and wherein the data logging unit provides an additional interface to the external device.

23. The testing apparatus of claim 1, wherein the data logging unit is further configured to receive a configuration signal, wherein the configuration signal controls which portions of the logging data received from the controller are to be recorded in the memory.

24. The testing apparatus of claim 1, wherein, for a given test cycle, the data logging unit is configured to record the at least a subset of the logging data until the at least one test result received from the comparator indicates an error.

25. The testing apparatus of claim 1, wherein, for a given test cycle, the data logging unit is configured to record the at least a subset of the logging data until the at least one test result received from the comparator indicates a pre-specified number of errors.

26. The testing apparatus of claim 1, wherein the data logging unit is configured to record a given subset of the logging data corresponding to a given subset of the at least one test result if the given subset of the at least one test result indicates an error.

27. The testing apparatus of claim 1, wherein the data logging unit is configured to record a given subset of the logging data and a corresponding given subset of the at least one test result in the memory if the given subset of the logging data comprises a pre-specified command.

28. The testing apparatus of claim 1, wherein the data logging unit is configured to record a given subset of the logging data and a corresponding given subset of the at least one test result in the memory if the given subset of the logging data comprises a pre-specified memory address.

29. The testing apparatus of claim 1, wherein the data logging unit is configured to record a given subset of the logging data and a corresponding given subset of the at least one test result in the memory if the given subset of the logging data comprises pre-specified data of interest.

30. A method of analyzing a memory module under test operating within an application system, wherein the memory module under test is coupled to a processor of the application system, wherein the method comprises:
a controller receiving first test data and first test response data from the application system, wherein the first test data comprises data transmitted to the memory module under test by the processor of the application system while the processor performs an application task, and wherein the first test response data comprises data transmitted from the memory module under test to the processor of the application system while the processor performs the application task;
the controller transmitting second test data to a reference memory module, wherein the second test data comprises at least a subset of the first test data;
the controller transmitting second test response data to at least one comparator, wherein the second test response data comprises at least a subset of the first test response data;
the controller transmitting, to a data logging unit, logging data, wherein the logging data comprises at least a portion of one or both of the first test data and the second test data, and at least a portion of one or both of the first test response data and the second test response data;
the at least one comparator receiving, from the reference memory module, reference response data generated by the reference memory module in response to the second test data transmitted to the reference memory module from the controller;
the at least one comparator receiving the second test response data from the controller;
the at least one comparator comparing the reference response data to the second test response data;
the at least one comparator generating at least one test result from at least one comparison of the reference response data with the second test response data;
the at least one comparator transmitting the at least one test result to the data logging unit;
the data logging unit receiving the logging data from the controller;
the data logging unit receiving the at least one test result from the at least one comparator; and
the data logging unit recording, in a memory, at least a subset of the logging data.

31. A testing apparatus for analyzing a memory module under test, wherein the testing apparatus comprises:
a first interface for coupling to an application system;
a second interface for coupling the memory module under test;
a controller coupled to the first and second interfaces, wherein the controller is configured to:
receive first test data and first reference response data from the application system via the first interface, wherein the first test data comprises data transmitted to a reference memory module, operating within an application system, by a processor of the application system while the processor performs an application task, and wherein the first reference response data comprises data transmitted from the reference memory module to the processor of the application system while the processor performs the application task;
transmit second test data to the memory module under test via the second interface, wherein the second test data comprises at least a subset of the first test data;

transmit second reference response data to at least one comparator, wherein the second reference response data comprises at least a subset of the first reference response data; and transmit logging data to a data logging unit, wherein the logging data comprises at least a portion of one or both of the first test data and the second test data, and at least a portion of one or both of the first reference response data and the second reference response data;

the at least one comparator, configured to:

receive, from the memory module under test, test response data generated by the memory module under test in response to the second test data transmitted to the memory module under test from the controller;

receive the second reference response data from the controller;

compare the test response data to the second reference response data;

generate at least one test result from at least one comparison of the test response data with the second reference response data; and transmit the at least one test result to the data logging unit;

and the data logging unit, wherein the data logging unit is configured to:

receive the logging data from the controller;

receive the at least one test result from the at least one comparator; and record, in a memory, at least a subset of the logging data.

* * * * *